United States Patent
Zhang et al.

(10) Patent No.: US 8,061,841 B2
(45) Date of Patent: Nov. 22, 2011

(54) CUSTOMIZING EQUIPMENT FOR INDIVIDUALIZED CONTACT LENSES

(75) Inventors: Yudong Zhang, Chengdu (CN); Jian Wang, Chengdu (CN); Lixin Zhao, Chengdu (CN); Song Hu, Chengdu (CN); Xiaochun Dong, Chengdu (CN); Xuejun Rao, Chengdu (CN); Hongtao Gao, Chengdu (CN); Yun Dai, Chengdu (CN)

(73) Assignee: Institute of Optics & Electronics, Chinese Academy of Sciences, Shuangliu, Chengdu, Sichuan (CN)

( * ) Notice: Subject to any disclaimer, the term of this patent is extended or adjusted under 35 U.S.C. 154(b) by 1110 days.

(21) Appl. No.: 11/896,967

(22) Filed: Sep. 7, 2007

(65) Prior Publication Data

US 2008/0062390 A1 Mar. 13, 2008

(30) Foreign Application Priority Data

Sep. 8, 2006 (CN) .............................. 200610113048

(51) Int. Cl.
*A61B 3/10* (2006.01)
(52) U.S. Cl. ........................................ 351/219; 351/221
(58) Field of Classification Search .................. 351/219, 351/221, 208, 209, 210, 205, 200
See application file for complete search history.

(56) References Cited

U.S. PATENT DOCUMENTS 7,543,939 B2 * 6/2009 Vilser et al. ................... 351/206

FOREIGN PATENT DOCUMENTS

| CN | 1573561 A | 2/2005 |
|---|---|---|
| CN | 1689538 A | 11/2005 |
| CN | 1702494 A | 11/2005 |

OTHER PUBLICATIONS

Junzhong Liang, Bernhard Grimm, Stefan Goelz & Josef F. Bille, "Objective measurement of wave aberrations of the human eye with the use of a Hartmann-Shack wave-front sensor", vol. 11, No. 7/Jul. 1994/J. Opt. Soc. Am. A, pp. 1949-1957.
Geun-Young Yoon & David R. Williams, "Visual performance after correcting the monochromatic and chromatic aberrations of the eye", J. Opt. Soc. Am. A/vol. 19, No. 2/Feb. 2002, pp. 266-275.

* cited by examiner

*Primary Examiner* — Hung Dang
(74) *Attorney, Agent, or Firm* — Lau & Associates, LLC.

(57) ABSTRACT

A customizing equipment for individualized contact lenses comprises an uniform illumination system, a gray image generation system, a projection optical system, a stage system and an alignment system, among which the uniform illumination system generates uniform parallel illuminative light, which generates gray images through the gray image generator controlled by a computer after going through the gray image generation system according to detection results of aberration of human eyes, and images on the image plane of given radius of curvature with photoresist on the samples' surface, which is fixed on the stage system and adjusted to the correct position through the alignment system, after the gray images are zoomed and the curvature of the image field is corrected through the projection optical system, so that the photoresist on the samples' surface will be exposed according to the gray levels of the gray images, after which the exposed samples are developed and etched to obtain the device with continuous embossment microstructure on the sphere. After the checking and post-processing, this device will result in the individualized contact lenses, which can be worn. This current invention can realizes fast customization of individualized contact lenses.

5 Claims, 2 Drawing Sheets

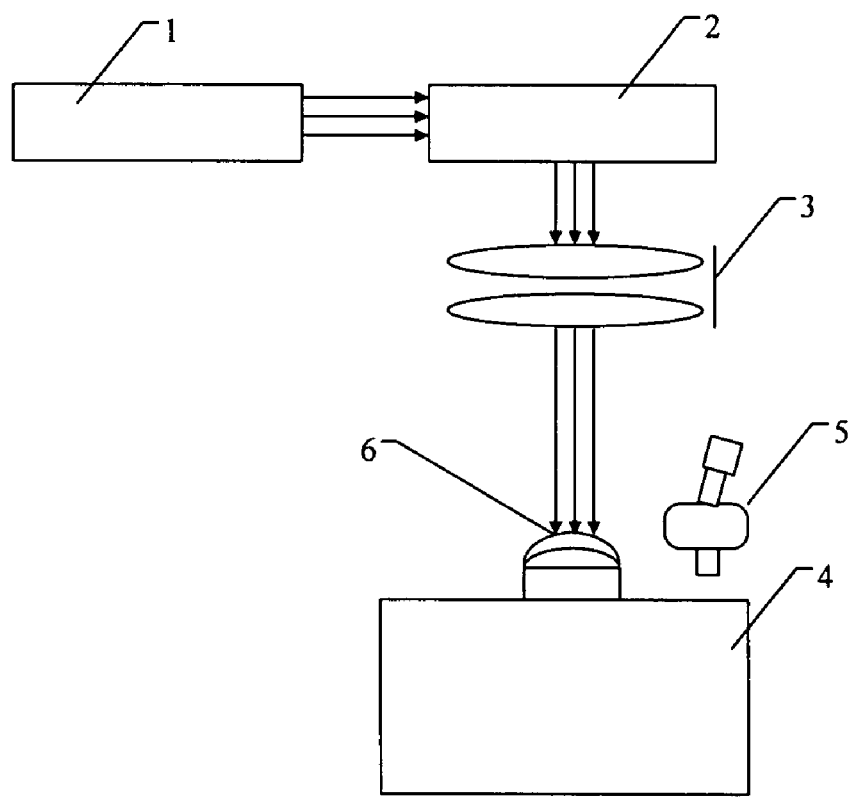
Figure 1
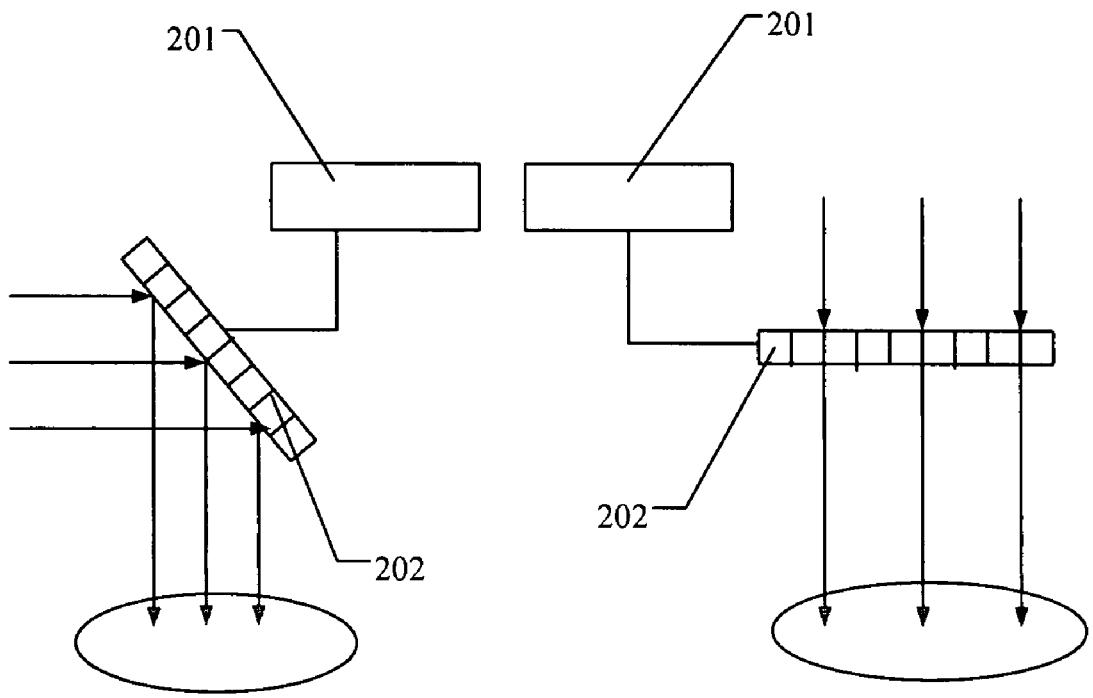
Figure 2a
Figure 2b

CUSTOMIZING EQUIPMENT FOR INDIVIDUALIZED CONTACT LENSES

FIELD OF THE INVENTION

The current invention relates to a customizing equipment for individualization contact lenses. It is a kind of technical equipment for making individualized contact lenses by etching microstructure on the sphere through the Maskless Lithography Technology.

BACKGROUND OF THE INVENTION

It has long been recognized that the normal human eye is not a perfect dioptric system, where there exists aberration to some extent, which degrades retinal imaging quality and limits visual sensitivity. Except that spherical mirror and cylindrical mirror can be corrected by some devices, such like spectacles, contact lenses, etc, the higher-order aberration, such as coma, spherical aberration, etc, still can't be corrected accurately and effectively by devices.

In 1962,Smirnov advanced higher-order aberration features of eyes firstly, and indicated that the aberration of human eyes could be corrected by individualized lenses. David Williams Lab has done some related experiments on the higher-order aberration correction of human eyes, which proved that if the higher-order aberration had been corrected, it would be helpful for improving image subjective quality ("Visual Performance after correcting the monochromatic and chromatic aberrations of the eye" Geun-Young Yoon and David R. Williams, J. Opt. Soc. Am. A/Vol. 19, No. 2/February). In 1994, Liang et al were firstly reported to measure the general aberration of dioptric system of human eyes with the use of a Hartmann-Shack wavefront sensor. ("Objective measurement of wavefront aberrations of the human eye with the use of a Shack-Hartmann wavefront sensor" J. Liang, B. Grimm and S. Goelx, et al, J. Opt. Soc. Am. A, 1994, 11:1949-1957). In 2005, the Adaptive Optics Lab of the Institute of Optics and Electronics the Chinese Academy of Science applied the patent, "Vision simulation system for binocular stereoscopic higher-order aberration correction" (Publication number CN 1689538A), in which they made out a device that can measure the higher-order aberration of human eyes exactly and established the foundation of higher-order aberration correction of human eyes. Subsequently, the Institute of Optics and Electronics the Chinese Academy of Science proposed a method of higher-order aberration correction of human eyes in the patent, "Correction method for higher-order aberration of human eyes" (Publication number CN 1702494A). Based on the analysis of various previous methods on higher-order aberration correction of human eyes, the method of aberration correction of human eyes in the way of individualized lenses is without doubt the securest, most convenient, and most economical.

However in the practical applications, there are still some problems in the manufacture of the individualized lenses which can be marketized.

(1) Based on the detected contribution of each order aberration to correction, continuous embossment microstructure needs to be made on the materials, which requirement is not easy to satisfy by the ordinary manufacturing means;

(2) The higher-order aberrations are different greatly from various human eyes, so higher-order aberration correction has no such generalization as lower-order aberration correction. Correction for higher-order aberration needs to detect the contribution of each order aberration to correction corresponding to different individual human eyes, and on the system with the corrected lower-order aberration, creates continuous embossment microstructure in the way of optical lithography, and compensates the detected aberration to make the system be an individual one, which can correct low-order and higher-order aberration at the same time. However, the construction of the mask of traditional lithography is fixed, poorly flexible, and costly, so that it can't satisfy the requirements of devices on individualization.

So in the manufacture of individualized lenses, maskless lithography technology has great superiority without doubt. Besides, in the aspect of maskless lithography technology, in 2005, ASML Ltd. in Netherlands won the invention patent, "System and method for maskless lithography using spatial light modulator array" ( publication number CN 1573561A), in which Spatial Light Modulator Array is applied, and the incidence uniform light is amplitude modulated, and the corresponding gray images is obtained, which is projected to planar object (including semiconductor wafer, glass substrate, and so on), and then the exposure is completed. However, since the made-out contact lenses needs to be worn close to eyeball and the correction of general diopter must be considered, this kind of lenses have to be spherical. That means continuous embossment microstructure should be etched on a sphere, not on an ordinary lithographic plane. But the technology in the patent of ASML can't resolve this problem of projection lithographic on the spherical surface.

DISCLOSURE OF THE INVENTION

The technical problem resolved by this current invention is: providing a kind of customizing equipment for individualized contact lenses, which can resolve the problem of projection lithographic on the spherical surface, and through the measured higher-order aberration of human eyes, according to the specificity of each people, make out individualized contact lenses with high quality, and improve the imaging quality of human eyes, and then make the cost of raw materials low as well.

The scheme of this current invention is: a customizing equipment for individualized contact lenses, characterized in that, it comprises an uniform illumination system, a gray image generation system, a projection optical system, a stage system and an alignment system, among which the uniform illumination system generates uniform parallel illuminative light, which generates gray images through the gray image generator controlled by a computer after going through the gray image generation system according to detection results of aberration of human eyes, and images on the image plane of given radius of curvature with photoresist on the samples' surface, which is fixed on the stage system and adjusted to the correct position through the alignment system, after the gray images are zoomed and the curvature of the image field is corrected through the projection optical system, so that the photoresist on the samples' surface will be exposed according to the gray levels of the gray images, after which the exposed samples are developed and etched to obtain the device with continuous embossment microstructure on the sphere. After the checking and post-processing, this device will result in the individualized contact lenses, which can be worn.

The benefits of this current invention are: comparing with the existing technology, the technology of this current invention applies the maskless lithography technology into the manufacture of individualized contact lenses instead of the mask in the ordinary optical lithography, and the manufacture can be flexible according to different structures for correction of higher-order aberration of each human eyes; during the lithography, the image will be exposed on the sphere, not on the traditional plane, according to the requirements on characteristics of lenses figure. The structure of this device is simple and reliable, and the made-out individualized lenses are high quality and low cost of raw materials, so that it has the future of wide marketization.

BRIEF DESCRIPTION OF THE DRAWINGS

FIG. 1 is the diagram of the structure of the current invention;

FIG. 2a and FIG. 2b are the diagrams of the structure of the gray image generation system in FIG. 1;

PREFERRED EMBODIMENTS OF THE INVENTION

Figure 3:
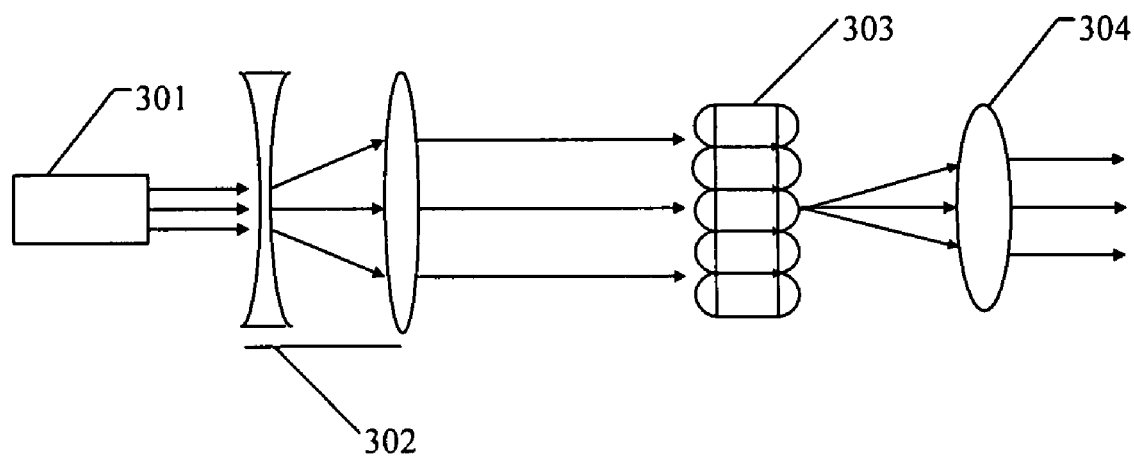
FIG. 3 is the diagram of the structure of the uniform illumination system in FIG. 1.

As shown in FIG. 1, the current invention comprises an uniform illumination system 1, a gray image generation system 2, a projection optical system 3, a stage system 4 and an alignment system 5, among which the uniform illumination system 1 generates uniform parallel illuminative light, which generates gray images through the gray image generator controlled by a computer after going through the gray image generation system 2 according to detection results of aberration of human eyes, and images on the image plane 6 of given radius of curvature with photoresist on the samples' surface, which is fixed on the stage system 4 and adjusted to the correct position through the alignment system 5, after the gray images are zoomed and the curvature of the image field is corrected through the projection optical system 3, so that the photoresist on the samples' surface will be exposed according to the gray levels of the gray images, after which the exposed samples are developed and etched to obtain the device with continuous embossment microstructure on the sphere.

The gray image generation system 2 comprises a gray image controller 201 and a gray image generator 202, and according to the working mode of the gray image generator 202, the operation mode of this system can be classified into two kinds, one is shown in FIG. 2a, in which according to the requirements, the gray image controller 201 controls the gray image generator 202 to make the reflector change correspondingly, and the uniform light irradiates on the gray image generator 202, after spatial modulation, to generate gray images with different gray levels, and then reflects to the projection optical system. This kind of operation mode is called the reflective, and the image generator of this kind includes reflective spatial light modulators such as DMD, reflective LCD, and so on; the other one is shown in FIG. 2b, in which according to the requirements, the gray image controller 201 controls the gray image generator 202 to change correspondingly, and the uniform light irradiates on the gray image generator 202, after spatial modulation, to generate gray images with different gray levels, and then transmits to the projection optical system. This kind of operation mode is called the transmissive, and the image generator of this kind includes transmissive spatial light modulators such as transmissive LCD, and so on. Through this system, the continuous gray images with microstructure, which satisfies the requirements of the correction of higher-order aberration of human eyes, can be obtained.

As shown in FIG. 3, the uniform illumination system 1 comprises a light source 301, an extender lens 302, a light energy uniform lens 303, and a collimation lens 304, the light source 301 is the monochromatic source sensitive to the selected photoresist including laser, LED, mercury lamp, xenon lamp and so on, and the light emitted from the light source 301 goes through the extender lens 302, and is uniformed by the light energy uniform lens 303, and then goes through the collimation lens 304 to be transformed to the parallel light, whose uniform of energy satisfies the requirement of lithography.

Figure 4:
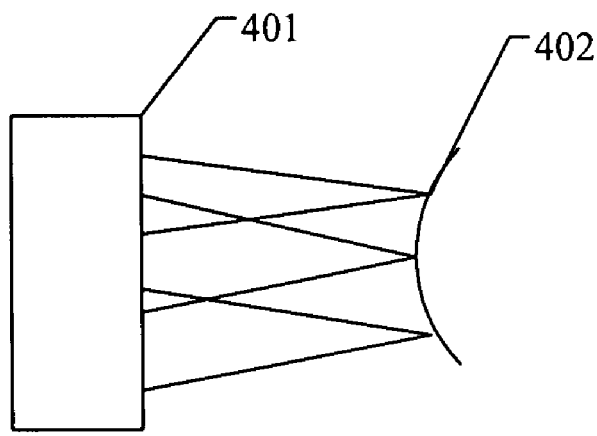
FIG. 4 is the diagram of the gray image projection in FIG. 1.

As shown in FIG. 4, the projection lens group 401 in the projection optical system 3 comprises a series of lenses. In optical design, if the image plane 402 of the projection lens are made to be the sphere with the given radius of curvature, the gray image generated by the gray image generation system can be projected to the spherical materials need to be exposed. Thus the defect that the ordinary lithography can only etch image on plane can be overcome.

The invention claimed is:

1. A customizing equipment for individualized contact lenses, comprising:
    an uniform illumination system (1);
    a gray image generation system (2);
    a projection optical system (3);
    a stage system (4); and
    an alignment system (5);
    wherein the uniform illumination system (1) generates uniform parallel illuminative light, which generates gray images through the gray image generation system (2) according to detection results of aberration of human eyes; and
    wherein images on the image plane of given radius of curvature with photoresist on the samples' surface, which is fixed on the stage system (4) and adjusted to the correct position through the alignment system (5)
    wherein after the gray images are zoomed and the curvature of the image field is corrected through the projection optical system (3), so that the photoresist on the samples' surface will be exposed according to the gray levels of the gray images, after which the exposed samples are developed and etched to obtain the device with continuous embossment microstructure on the sphere.

2. The customizing equipment for individualized contact lenses according to claim 1, wherein said gray image generation system (2) comprises a gray image controller (201) and a gray image generator (202), in which the gray image generator (202) is a reflective spatial modulator, and according to the requirements, the gray image controller (201) controls the gray image generator (202) to make the reflector change correspondingly, and the uniform light irradiates on the gray image generator (202), after spatial modulation, to generate gray images with different gray levels, and then reflects to the projection optical system.

3. The customizing equipment for individualized contact lenses according to claim 1, wherein said gray image generation system (2) comprises a gray image controller (201) and a gray image generator (202), in which the gray image generator (202) is a transmissive spatial modulator, and according to the requirements, the gray image controller (201) controls the gray image generator (202) to make the reflector change correspondingly, and the uniform light irradiates on the gray image generator (202), after spatial modulation, to generate gray images with different gray levels, and then transmits to the projection optical system.

4. The customizing equipment for individualized contact lenses according to claim 1, wherein the described uniform illumination system (1) comprises a light source (301), an extender lens (302), a light energy uniform lens (303), and a collimation lens (304), and wherein the light emitted from the light source (301) goes through the extender lens (302), and is uniformed by the light energy uniform lens (303) to obtain the light, whose uniform of energy satisfies the requirement of lithography, and then the light is collimated through the collimation lens (304) to be the required parallel light.

5. The customizing equipment for individualized contact lenses according to claim 4, wherein the light source in the uniform illumination system(1) is the monochromatic source sensitive to the selected photoresist including laser, LED, mercury lamp, xenon lamp and so on.

* * * * *